(12) United States Patent
Chittipeddi

(10) Patent No.: US 6,706,603 B2
(45) Date of Patent: Mar. 16, 2004

(54) METHOD OF FORMING A SEMICONDUCTOR DEVICE

(75) Inventor: Sailesh Chittipeddi, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/792,266

(22) Filed: Feb. 23, 2001

(65) Prior Publication Data

US 2002/0119636 A1 Aug. 29, 2002

(51) Int. Cl.[7] .......................................... H01L 21/8238
(52) U.S. Cl. ...................... 438/268; 438/199; 438/138; 438/206
(58) Field of Search ................................ 438/268, 206, 438/209, 212, 213, 270, 275, 282, 585, 578, 283, 640, 269, 157, 138, 309, 137

(56) References Cited

U.S. PATENT DOCUMENTS

| | | | | |
|---|---|---|---|---|
| 6,027,975 | A | * | 2/2000 | Hergenrother et al. ...... 438/268 |
| 6,300,199 | B1 | * | 10/2001 | Reinberg .................... 438/268 |
| 6,372,559 | B1 | * | 4/2002 | Crowder et al. ............ 438/157 |
| 6,377,070 | B1 | * | 4/2002 | Forbes ........................ 326/41 |
| 6,603,168 | B1 | * | 8/2003 | Choi .......................... 257/306 |
| 2003/0047749 | A1 | * | 3/2003 | Chaudhry et al. .......... 257/135 |
| 2003/0052721 | A1 | * | 3/2003 | Chaudhry et al. .......... 327/242 |
| 2003/0119237 | A1 | * | 6/2003 | Chittipeddi et al. ........ 438/199 |

FOREIGN PATENT DOCUMENTS

JP         1298097   *   3/2000   ................ 29/78

OTHER PUBLICATIONS

Hergenrother, J.M., et al., "The Vertical Replacement-Gate (VRG) MOSFET: A 50–nm Vertical MOSFET With Lithography-Independent Gate Length", I.E.E.E., 4 pages (Mar., 1999).*

Hergenrother, J.M., et al., "A 50–nm Vertical Replacement–Gate (VRG) nMOSFET With ALD Hf) and AlO Gate Dielectrics", I.E.E.E., 4 pages (2001).*

* cited by examiner

Primary Examiner—Wael Fabemy
Assistant Examiner—Laura M Schillinger

(57) ABSTRACT

The present invention provides a method of forming a vertical replacement gate (VRG) device on a semiconductor substrate. The method includes depositing an epitaxial layer over a first source/drain region, implanting a layer within the epitaxial layer wherein the thickness of the layer substantially defines a channel length of the device and replacing the layer with a gate layer.

26 Claims, 4 Drawing Sheets

METHOD OF FORMING A SEMICONDUCTOR DEVICE

TECHNICAL FIELD OF THE INVENTION

The present invention is directed, in general, to a method of manufacturing a semiconductor device and, more specifically, to an improved method of manufacturing a vertical replacement gate (VRG) device wherein the channel length of the VRG is defined by implanting an epitaxial layer with an oxide and replacing the oxide with a gate material.

BACKGROUND OF THE INVENTION

Enhancing semiconductor device performance continues to be a focus of the semiconductor industry. As a result, both smaller device size and increased performance have been identified as desirable manufacturing targets. As device dimensions within semiconductor devices, such as gates within integrated circuits (ICs), continue to shrink, the method for forming such gates has adapted to effectively accomplish the shrinking devices.

However, manufacturing limitations have particularly arisen with respect to the lithographic processes currently used to manufacture such smaller devices. In fact, current lithographic processes have been unable to accurately manufacture devices at the required minimal sizes. Moreover, this is a limitation that has presented a significant challenge to the semiconductor industry.

In view of the current limitations in the semiconductor manufacturing lithography process, and the desire to manufacture smaller devices, the semiconductor industry developed a vertical replacement gate (VRG) device structure, such as a VRG MOSFET. The VRG MOSFET structure circumvents the limitations associated with the lithographic process discussed above, by keeping each individual device component within functional lithographic limitations and building the devices vertically rather than horizontally on the semiconductor wafer. This allows overall device performance of the semiconductor wafer to be increased without encountering the lithographic limitations discussed above.

Unfortunately, conventional techniques commonly employed to form VRG devices are often process and labor intensive. At the outset of the manufacturing process, after a bottom source/drain layer has been implanted on a semiconductor wafer, several steps are still required before a trench can be etched. Specifically, the silicon wafer is placed in a first chamber where a bottom, doped layer, such as a p-type tetraethylorthosilicate (TEOS) layer, is first deposited or grown on the wafer. This first layer is deposited or grown using chemical vapor deposition (CVD). The layer is then planarized, perhaps with a chemical-mechanical planarization (CMP) process, before a second layer may be placed atop the first. After the CMP process, the wafer is taken to a different chamber where a second, sacrificial layer, usually comprising an oxide or nitride, is deposited or grown on top of the first layer. Then, as before, the wafer is taken back for the second layer to undergo the CMP process. The wafer is then taken back to the first chamber where an upper, doped TEOS layer is deposited or grown on top of the planarized sacrificial layer. Finally, the wafer is taken yet again to a CMP device where the third layer is planarized, so that an upper source/drain layer may eventually be deposited or grown on the planarized surface of this upper, doped TEOS layer.

In view of the foregoing, it is clear that common techniques for manufacturing a VRG device result in a time-consuming process. Moreover, these commonly used methods of manufacturing are also labor-intensive, with respect to both man and machine. As such, VRG manufacturing processes are often costly affairs, in spite of the advantages offered by VRG devices. With the already high cost of semiconductor manufacturing and a market already fraught with intense competition, manufacturers must make every effort to stream-line the manufacturing process.

Accordingly, what is needed in the art is an improved method of manufacturing a VRG device on a semiconductor wafer that does not suffer from the deficiencies of methods found in the prior art.

SUMMARY OF THE INVENTION

To address the above-discussed deficiencies of the prior art, the present invention provides an improved method of manufacturing a device. In one embodiment, the method includes depositing an epitaxial layer over a first source/drain region. A sacrificial layer is implanted within the epitaxial layer to preferably create first and second epitaxial layers. The thickness of the sacrificial layer substantially defines a channel length of the device. A trench is formed through the epitaxial layer and is filled with silicon to create a source/drain channel. The method may also include forming lightly doped drain regions on opposing sides of the source/drain channel. Gate oxides are also formed between the lightly doped drain regions. The sacrificial layer is removed and replaced with a gate layer. Other steps may include replacing the first and second epitaxial layers with first and second oxide layers and depositing a second source/drain region over the source/drain channel to thereby connect the first and second source/drain regions with the source/drain channel.

The foregoing has outlined, rather broadly, preferred and alternative features of the present invention so that those skilled in the art may better understand the detailed description of the invention that follows. Additional features of the invention are described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Referring to FIGS. 1A through 1J, illustrated are sectional views of an advantageous embodiment of progressive steps of a method of manufacturing a device, such as a vertical replacement gate (VRG) metal-oxide semiconductor field effect transistor (MOSFET), according to the principles of the present invention.

Turning initially to FIG. 1, a VRG MOSFET 100 is formed on a semiconductor substrate 105, typically comprised of silicon. In one aspect of the present invention, the VRG MOSFET 100 is a p channel metal oxide semiconductor (PMOS) device, however the VRG MOSFET 100 may alternatively be an n channel metal oxide semiconductor (NMOS) or other MOS device. In this particular embodiment, a first source/drain region 110 is deposited in the substrate 105 using a conventional process. In an exemplary embodiment of the present invention, the first source/drain region 110 is comprised of highly doped p-type silicon, however, the present invention may also be applicable with other dopants and substrate materials.

An epitaxial (epi) layer 115 is then formed to the desired thickness over the first source/drain region 110 and the substrate 105 using conventional techniques. In the prior art, at this stage of the manufacturing process a series of layer depositions and planarization occurs, as described in detail above. However, according to the principles of the present invention, the single epi layer 115 replaces the multiple layers found in the prior art, each of which requires different deposition processes and planarization before the next may deposited or grown.

Figure 1A:
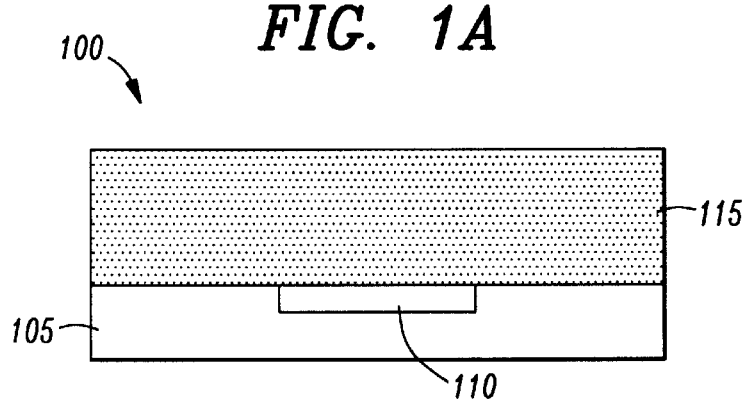
FIGS. 1A through 1J illustrate sectional views of progressive steps of a method of manufacturing a VRG metal-oxide semiconductor field effect transistor (MOSFET) according to the principles of the present invention.
Figure 1B:
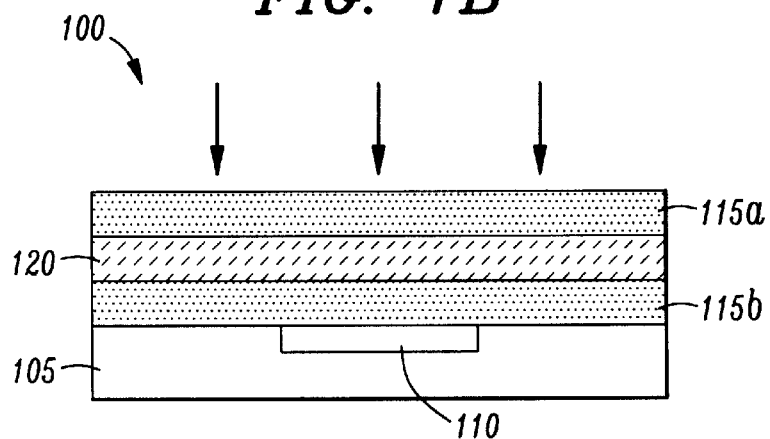

Turning to FIG. 1B, there is illustrated a step wherein a dielectric material is diffused or implanted within the epi layer 115 to form a sacrificial dielectric layer 120 within the epi layer 115. In a particularly advantageous embodiment, the layer 120 is formed by implanting an oxide and annealing the oxide to form a silicon-dioxide ($SiO_2$) layer. In an alternative embodiment, the layer 120 is formed by implanting nitride within the epi layer 115 and annealing the nitride to form the layer 120. Of course, in other embodiments, other dielectric materials may be implanted within the epi layer 115. When the dielectric is formed within the epi layer 115, the implantation results in an epi layer 115 divided into first and second epi regions 115a, 115b.

Those skilled in the art understand the techniques employed to accurately implant oxides and nitrides within existing layers of a semiconductor substrate 105, as well as the advantages and precision associated therewith. In the exemplary embodiment discussed above, the oxide or nitride is implanted at a precise depth within the epi layer 115, and with a predetermined thickness, to create the layer 120, which can be, of course, varied. Accordingly, the thickness of the layer 120 can be used to substantially define the channel length of the VRG MOSFET 100.

By growing a single epi layer 115 having a thickness approximately the same as the multiple layers found in the prior art, and then diffusing or implanting the layer 120, the steps of depositing and planarizing each of the multiple layers is eliminated, which not only simplifies the process, but also reduces manufacturing time and expense associated with prior art processes. Thus, with the method of the present invention, manufacturers realize the costs savings provided by reducing the steps required, as well as the complexity of the process, and consequently the time needed, to manufacture devices on a semiconductor wafer.

Figure 1C:
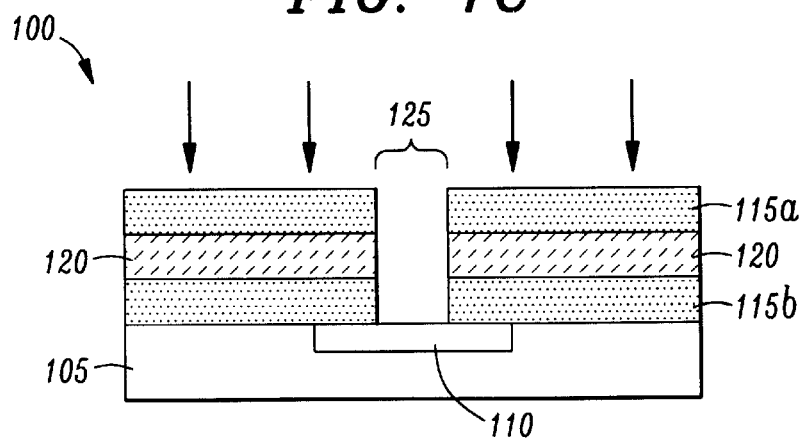

Turning now to FIG. 1C, another stage in the manufacturing process is illustrated. With the epi layer 115 divided into first and second epi regions 115a, 115b by the layer 120 implanted therein, a light dopant is then implanted into the first and second epi regions 115a, 115b. By lightly doping the first and second epi regions 115a, 115b, lightly doped drain (LDD) regions may be formed later during the manufacturing process.

After the first and second epi regions 115a, 115b are doped with the light dopant, a trench 125 is formed through the epi regions 115a, 115b and to the source/drain region 110. The trench 125 may be formed using known trench-etching methods.

Figure 1D:
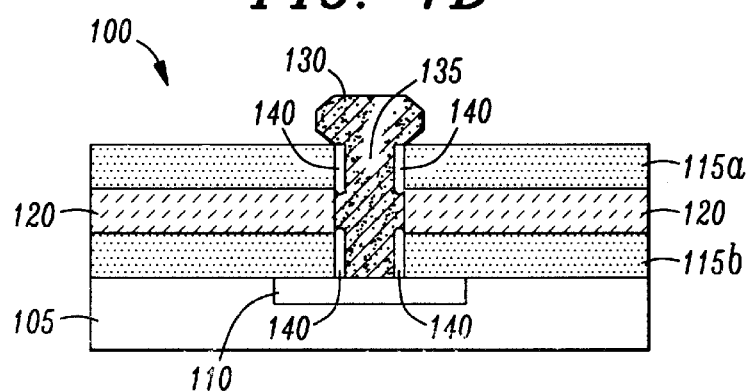

Looking now at FIG. 1D, epi material 130 is conventionally grown in the trench 125 to form a source/drain channel 135. In an exemplary embodiment, the epi material 130 may be silicon or other similarly suited materials. When filling the trench 125, as the epi material 130 grows it begins to "mushroom" out of the trench 125 and atop the first epi region 115a. This excess epi material 130 is removed later in the manufacturing process.

The VRG MOSFET 100 is then annealed and diffused through known techniques. By annealing and diffusing the VRG MOSFET 100, LDD regions 140 are formed from the light dopant implanted in the first and second epi regions 115a, 115b earlier in the manufacturing process. The LDD regions 140 are located along opposing inner walls of the first and second epi regions 115a, 115b divided by the layer 120. The LDD regions 140 extend slightly beyond the thickness of the first and second epi regions 115a, 115b within the source/drain channel 135.

Figure 1E:
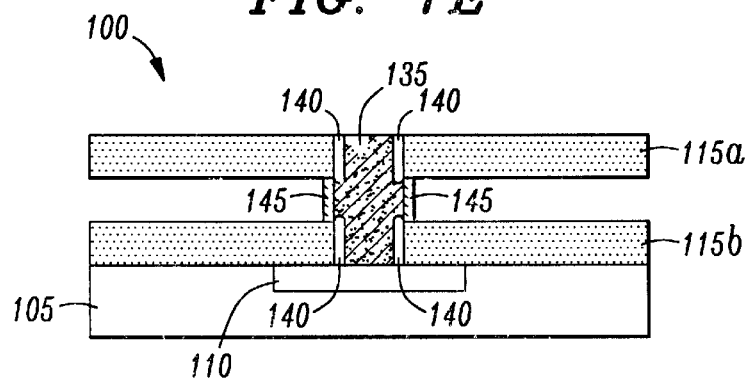

After the formation of the source/drain channel 135, the portion of the epi material that extends beyond the source/drain channel 135 is planarized, which results in the intermediate device shown in FIG. 1E. Specifically, the first epi region 115a, as well as any epi material 130 protruding from the trench 125, is planarized, preferably using a chemical-mechanical planarization (CMP) process.

At this stage, the steps required to form an operative gate for the VRG MOSFET 100 are begun. The layer 120 is removed using conventional etching processes and gate oxides 145 are grown using the silicon in the source/drain channel 135 to form the gate oxides 145. As a result, the gate oxides 145 are positioned on opposing sides of the source/drain channel 135 and substantially between the upper and lower LDD regions 140 formed earlier. As seen from the foregoing, the thickness of the layer 120 governs the width of the channel and the gate oxides 145.

Figure 1F:
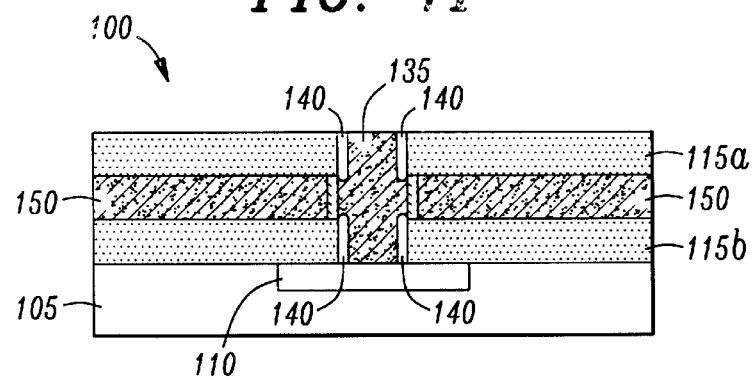

Moving on to FIG. 1F, illustrated is the implanting of the conductive material used to form the gate layer 150. As illustrated, the gate layer 150 is formed in the open space previously occupied by the sacrificial layer 120. In a particularly advantageous embodiment, the material comprising the gate layer 150 is polysilicon. Of course, other conductive materials capable of functioning as the gate layer 150 for a device are also within the broad scope of the present invention.

As mentioned above, the thickness of the layer 120 substantially defines the channel length of the VRG MOSFET 100, since the gate layer 150 now occupies the same space as the previous layer 120. By implanting the layer 120 and then replacing it with the gate layer 150, the method of the present invention may provide extremely small channel lengths in the VRG MOSFET 100 (for example, less than 30 nm) in fewer manufacturing steps than required using prior art methods of manufacturing.

Figure 1G:
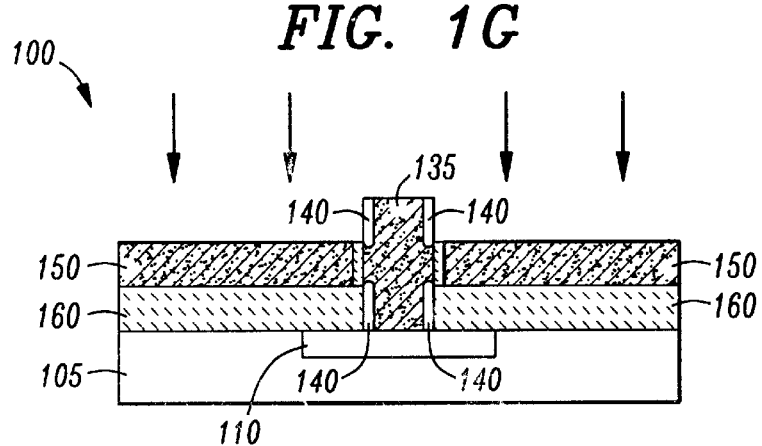

Turning to FIG. 1G, illustrates where the first epi region 115a of the epi layer 115 has been conventionally removed with an etching step. By removing the first epi region 115a, the source/drain channel 135, the upper LDD regions 140, and the top of the gate layer 150 are now exposed and an oxide is implanted into the second epi region 115b and is annealed to form a first dielectric layer 160. Those skilled in the art understand the precision achievable using known implanting techniques. This level of precision is achieved by varying the dopant used, the temperature and the pressure, as well as other parameters. The new dielectric layer 160 insulates the gate layer 150 from the first source/drain region 110 so as to prevent undesired electrical conduction through various layers that would short-circuit the VRG MOSFET 100 during operation.

Figure 1H:
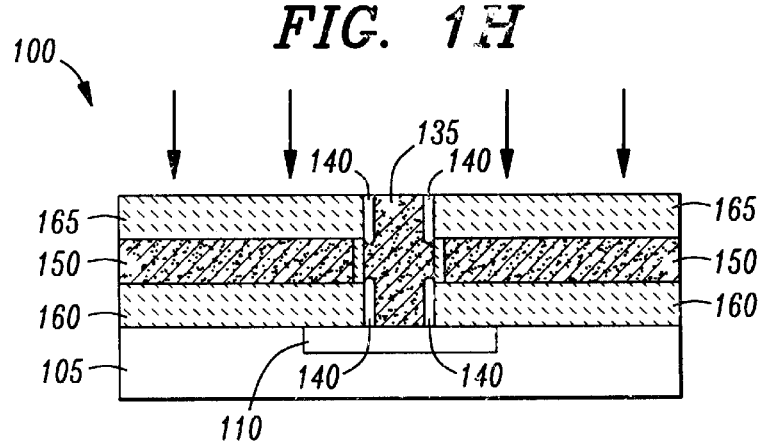

Turning now to FIG. 1H, an oxide is deposited over and around the exposed source/drain channel 135 and upper LDD regions 140 to replace the removed first epi region 115a. The oxide is then annealed so that a second dielectric layer 165 now stands in place of the first epi region 115a. Like the first, this second dielectric layer 165 also isolates the gate layer 150. It should be noted that FIGS. 1G and 1H illustrate only a particularly advantageous embodiment of the present invention. Alternatively, the first and second epi regions 115a, 115b may simply be implanted with an oxide without first removing the first epi region 115a. In such an embodiment, the first and second epi regions 115a, 115b are implanted oxide and annealed to transform the first and second epi regions 115a and 115b into the first and second dielectric layers 160 and 165.

Figure 1I:
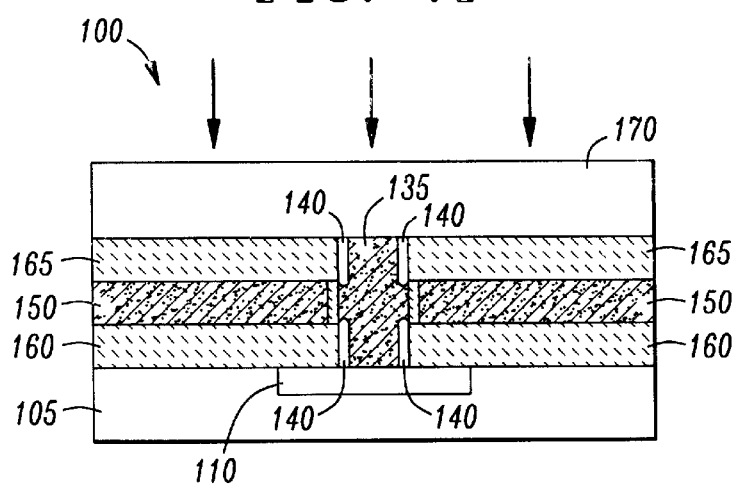

Turning to FIG. 1I, after formation of the first and second dielectric layers 160 and 165, the VRG MOSFET 100 is conventionally planarized. After the upper surface of the VRG MOSFET 100 has undergone planarization, a second source/drain region 170 is deposited on the freshly planarized upper surface. Depositing the second source/drain region 170 on top of the VRG MOSFET 100 connects the first source/drain region 110 to the second source/drain region 170 via the source/drain channel 135. Within the source/drain channel 135, the LDD regions 140 and gate oxides 145 cooperate with the gate layer 150 to form an operative, conductive VRG in the VRG MOSFET 100.

Figure 1J:
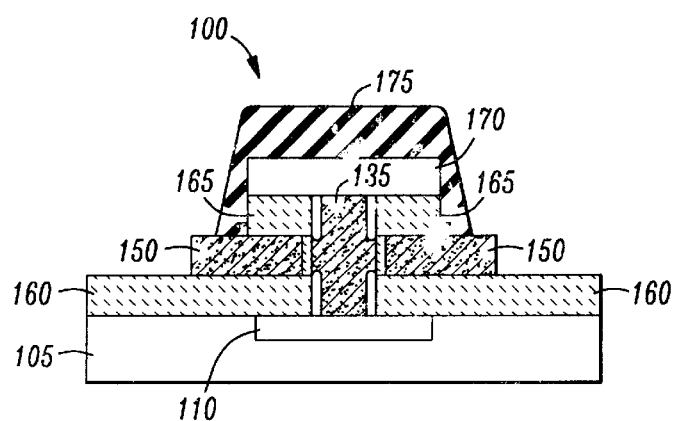

Following the formation of the second source/drain region 170, other conventional steps are followed to form a completed VRG MOSFET 100 as illustrated in FIG. 1J. The VRG MOSFET 100 may be interconnected with other devices within an integrated circuit (not shown) formed on the semiconductor substrate 105. In addition, a dielectric insulator 175 is formed around outer portions of the VRG MOSFET 100, to further electrically insulate the device.

While only one method of manufacturing a VRG MOSFET on a semiconductor wafer substrate has been described with reference to FIGS. 1A through 1J, the present invention is not limited to any single method and is broad enough to encompass any equivalent method of manufacturing. Furthermore, the present invention is not limited to VRG devices, and those skilled in the art may envision using the method of the present invention to manufacture other device structures, either now existing or later developed. Moreover, other embodiments of the method of manufacturing a device according to the present invention may have additional or fewer steps than described above. The steps in the manufacturing process of the present invention may also be executed in an order different than described above without departing from the broad scope of the present invention. Irrespective of the variations in steps or the order thereof, or the type of device manufactured, the advantages of the present invention described above are still realized.

Figure 2:
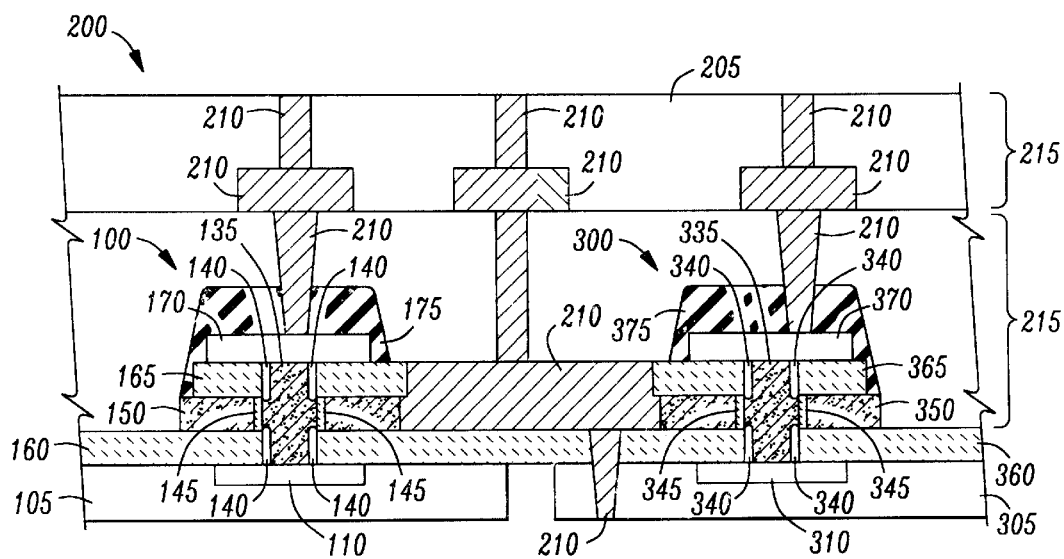
FIG. 2 illustrates a conventional integrated circuit having multiple VRG MOSFETs, manufactured according to the principles of the present invention, located therein.

Now turning to FIG. 2, with continued reference to FIGS. 1A–1J, illustrated is a conventional integrated circuit 200 employing the completed VRG MOSFET 100 illustrated in FIG. 1J. The integrated circuit 200 is located on a portion of a semiconductor wafer 205, and is illustrated having first and second MOSFETs 100, 300. Each of the MOSFETs 100, 300 includes a VRG manufactured according to the principles of the present invention.

Specifically, the first VRG MOSFET 100 includes the semiconductor substrate 105, first and second source/drain regions 110, 170, the first and second dielectric layers 160, 165 and the dielectric insulator 175 as described above. In addition, the first VRG MOSFET 100 includes the gate layer 150, LDD regions 140 and gate oxides 145 all located within the source/drain channel 135 and formed by the above-described processes. The second VRG MOSFET 300, which may also be formed in a similar manner, includes first and second source/drain regions 310, 370, first and second dielectric layers 360, 365 and a dielectric insulator 375, all formed on a substrate 305 of the semiconductor wafer 205. The second VRG MOSFET 300 further includes a gate layer 350, LDD regions 340 and gate oxides 345 all located within its own source/drain channel 335.

The integrated circuit 200 further includes conventionally formed interconnect structures 210 formed in conventionally formed interlevel dielectric layer 215. The interconnect structures 210 provide electrical connections between the first and second VRG MOSFETs 100, 300, and between either the first or second VRG MOSFET 100, 300 and other devices (not illustrated) formed on the semiconductor wafer 205. Once all the necessary interconnections 210 are made, the result is an operable integrated circuit 200. One having skill in the art understands that additional devices manufactured according to the principles described herein, may be located within the integrated circuit 200 and connected to the other devices formed therein. As such, the present invention is not limited to any particular number of devices.

Accordingly, although the present invention has been described in detail, those skilled in the art should understand that they can make various changes, substitutions and alterations herein without departing from the spirit and scope of the invention in its broadest form.

What is claimed is:

1. A method of forming a device on a semiconductor substrate, comprising:

depositing an epitaxial layer over a first source/drain region located within a substrate;

implanting a sacrificial layer into the epitaxial layer to divide the epitaxial layer into first and second epitaxial layers, wherein the sacrificial layer is located between the first and second epitaxial layers, the thickness of the sacrificial layer substantially defining a channel length of the device; and replacing the sacrificial layer with a gate layer.

2. The method as recited in claim 1 further comprising forming a trench through the epitaxial layer prior to replacing the sacrificial layer.

3. The method as recited in claim 2 further including epitaxially filling the trench with silicon to form a source/drain channel.

4. The method as recited in claim 3 further including forming lightly doped drain regions in the source/drain channel.

5. The method as recited in claim 3 further including forming gate oxides on opposing sides of the source/drain channel prior to replacing the sacrificial layer with the gate layer.

6. The method as recited in claim 1 further including creating a second source/drain layer over the gate layer.

7. The method as recited in claim 1, wherein implanting a sacrificial layer includes implanting an oxide or nitride layer.

8. The method as recited in claim 7 further including annealing the oxide or nitride layer.

9. The method as recited in claim 1, wherein replacing the sacrificial layer includes replacing the sacrificial layer with a gate layer comprised of polysilicon.

10. The method as recited in claim 1 wherein implanting a sacrificial layer within the epitaxial layer includes removing the first epitaxial layer subsequent to replacing the sacrificial layer with the gate layer.

11. The method as recited in claim 10 further including depositing an oxide layer over the gate layer and the source/drain channel.

12. The method as recited in claim 10 further including implanting the second epitaxial layer with an oxide.

13. The method as recited in claim 12 wherein implanting the second epitaxial includes implanting the second epitaxial region subsequent to removing the first epitaxial layer.

14. A method of forming an integrated circuit, comprising:
    forming a device on a semiconductor substrate, including:
        depositing an epitaxial layer over a first source/drain region located within a substrate;
        implanting a sacrificial layer within the epitaxial layer to divide the epitaxial layer into first and second epitaxial layers wherein the sacrificial layer is located between the first and second epitaxial layers, the thickness of the sacrificial layer substantially defining a channel length of the device;
        replacing the sacrificial layer with a gate layer;
    depositing dielectric layers over the device; and
    forming interconnections in the dielectric layers to interconnect the device to form an operative integrated circuit.

15. The method as recited in claim 14 further comprising forming a trench through the epitaxial layer prior to replacing the sacrificial layer.

16. The method as recited in claim 15 further including epitaxially filling the trench with silicon to form a source/drain channel.

17. The method as recited in claim 16 further including forming lightly doped drain regions in the source/drain channel.

18. The method as recited in claim 16 further including forming gate oxides on opposing sides of the source/drain channel prior to replacing the sacrificial layer with the gate layer.

19. The method as recited in claim 14 further including creating a second source/drain layer over the gate layer.

20. The method as recited in claim 14, wherein implanting a sacrificial layer includes implanting an oxide or nitride layer.

21. The method as recited in claim 20 further including annealing the oxide or nitride layer.

22. The method as recited in claim 14, wherein replacing the sacrificial layer includes replacing the sacrificial layer with a gate layer comprised of polysilicon.

23. The method as recited in claim 14 wherein implanting a sacrificial layer within the epitaxial layer includes removing the first epitaxial layer subsequent to replacing the sacrificial layer with a sacrificial gate layer.

24. The method as recited in claim 23 further including depositing an oxide layer over the gate layer and the source/drain channel.

25. The method as recited in claim 23 further including implanting the second epitaxial layer with an oxide.

26. The method as recited in claim 25 wherein implanting the second epitaxial layer includes implanting the second epitaxial layer subsequent to removing the first epitaxial layer.

* * * * *